United States Patent
Gao et al.

(10) Patent No.: US 8,607,438 B1
(45) Date of Patent: Dec. 17, 2013

(54) METHOD FOR FABRICATING A READ SENSOR FOR A READ TRANSDUCER

(75) Inventors: Wei Gao, Fremont, CA (US);
Guanxiong Li, Fremont, CA (US);
Ming Mao, Dublin, CA (US);
Chih-Ching Hu, Pleasanton, CA (US);
Guanghong Luo, Fremont, CA (US);
Miao Wang, San Jose, CA (US);
Zhihong Zhang, Fremont, CA (US);
Anup G. Roy, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 39 days.

(21) Appl. No.: 13/309,357

(22) Filed: Dec. 1, 2011

(51) Int. Cl.
*G11B 5/127* (2006.01)
*H04R 31/00* (2006.01)

(52) U.S. Cl.
USPC .............. 29/603.14; 29/603.12; 29/603.13; 29/603.16; 29/603.18; 216/32; 216/65; 216/66; 360/324.1; 360/324.11; 360/324.12; 360/324.2

(58) Field of Classification Search
USPC .............. 29/603.07, 603.12–603.16, 603.18; 216/62, 65, 66; 360/324.1, 324.11, 360/324.12, 324.2; 451/5, 41
See application file for complete search history.

(56) References Cited

U.S. PATENT DOCUMENTS

| | | |
|---|---|---|
| 5,438,747 A | 8/1995 | Krounbi et al. |
| 5,867,890 A | 2/1999 | Hsiao et al. |
| 5,874,010 A | 2/1999 | Tao et al. |
| 6,043,960 A | 3/2000 | Chang et al. |
| 6,472,107 B1 | 10/2002 | Chan |
| 6,692,898 B2 | 2/2004 | Ning |
| 6,729,014 B2 | 5/2004 | Lin et al. |
| 6,737,281 B1 | 5/2004 | Dang et al. |
| 6,861,177 B2 | 3/2005 | Pinarbasi et al. |
| 6,862,798 B2 | 3/2005 | Kruger et al. |
| 6,872,467 B2 | 3/2005 | Qian et al. |
| 6,983,531 B2 | 1/2006 | Horng et al. |
| 7,024,756 B2 | 4/2006 | Le et al. |
| 7,070,698 B2 | 7/2006 | Le |
| 7,120,988 B2 | 10/2006 | Le et al. |
| 7,120,989 B2 | 10/2006 | Yang et al. |
| 7,186,348 B2 | 3/2007 | Chen et al. |
| 7,380,332 B2 | 6/2008 | Bedell et al. |
| 7,441,325 B2 | 10/2008 | Gao et al. |
| 7,464,457 B2 | 12/2008 | Le et al. |
| 7,469,467 B2 | 12/2008 | Gao et al. |
| 8,333,898 B2 * | 12/2012 | Brown et al. ................ 216/22 |
| 2001/0001256 A1 * | 5/2001 | Hsiao ...................... 360/246.6 |
| 2004/0229430 A1 | 11/2004 | Findeis et al. |
| 2005/0024779 A1 | 2/2005 | Le et al. |
| 2005/0066517 A1 | 3/2005 | Bedell et al. |

(Continued)

*Primary Examiner* — Paul D Kim (57) ABSTRACT

A read sensor for a transducer is fabricated. The transducer has a field region and a sensor region corresponding to the sensor. A sensor stack is deposited. A hybrid mask including hard and field masks is provided. The hard mask includes a sensor portion covering the sensor region and a field portion covering the field region. The field mask covers the field portion of the hard mask. The field mask exposes the sensor portion of the hard mask and part of the sensor stack between the sensor and field regions. The sensor is defined from the sensor stack in a track width direction. Hard bias layer(s) are deposited. Part of the hard bias layer(s) resides on the field mask. Part of the hard bias layer(s) adjoining the sensor region is sealed. The field mask is lifted off. The transducer is planarized.

11 Claims, 8 Drawing Sheets

(56) References Cited

U.S. PATENT DOCUMENTS

| | | |
|---|---|---|
| 2005/0117251 A1 | 6/2005 | Matono et al. |
| 2005/0185332 A1 | 8/2005 | Hsiao et al. |
| 2005/0241140 A1 | 11/2005 | Baer et al. |
| 2005/0264949 A1 | 12/2005 | Gao et al. |
| 2006/0028762 A1 | 2/2006 | Gao et al. |
| 2006/0174474 A1 | 8/2006 | Le |
| 2006/0234483 A1 | 10/2006 | Araki et al. |
| 2006/0288565 A1 | 12/2006 | Le et al. |
| 2007/0026537 A1 | 2/2007 | Jiang et al. |
| 2007/0026538 A1 | 2/2007 | Jayasekara |
| 2007/0113395 A1 | 5/2007 | Dulay et al. |
| 2007/0183093 A1 | 8/2007 | Le et al. |
| 2007/0245544 A1 | 10/2007 | Allen et al. |
| 2007/0245545 A1 | 10/2007 | Pentek et al. |
| 2007/0258167 A1 | 11/2007 | Allen et al. |
| 2008/0072417 A1 | 3/2008 | Hsu et al. |
| 2009/0310256 A1 | 12/2009 | Albrecht et al. |
| 2010/0024201 A1 | 2/2010 | Le et al. |

\* cited by examiner

METHOD FOR FABRICATING A READ SENSOR FOR A READ TRANSDUCER

BACKGROUND

Figure 1:
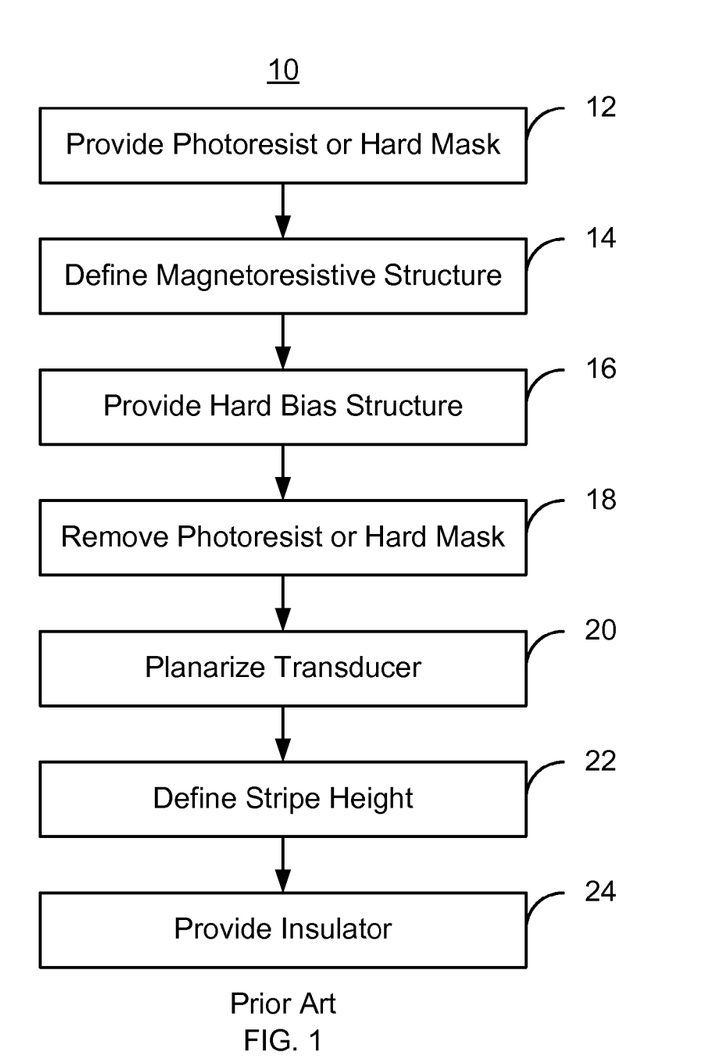
FIG. 1 is a flow chart depicting a conventional method for fabricating a read sensor for a magnetic recording transducer.

FIG. 1 depicts a conventional method 10 for fabricating a magnetoresistive sensor in magnetic recording technology applications. The method 10 typically commences after a conventional magnetoresistive or tunneling magnetoresistive (TMR) stack has been deposited. The conventional read sensor stack typically includes an antiferromagnetic (AFM) layer, a pinned layer, a nonmagnetic spacer layer, and a free layer. In addition, seed and/or capping layers may be used. The conventional magnetoresistive stack resides on an underlayer, which may be a substrate.

The conventional method 10 commences by providing a conventional mask for the read sensor, via step 12. The mask provided is either a conventional hard mask or a conventional photoresist mask. The conventional photoresist mask covers the region from which the conventional magnetoresistive sensor is to be formed, as well as a portion of the transducer distal from the sensor termed the field region The magnetoresistive structure is defined using the conventional mask, via step 14. Step 14 typically includes ion milling the transducer. Thus, the portion of the magnetoresistive stack exposed by the conventional mask is removed. The magnetoresistive structure being defined may be a magnetoresistive sensor for a read transducer.

The hard bias material(s), such as CoPt, are deposited, via step 16. In addition, seed and/or capping layers may be provided in step 16. The hard bias material(s) and other layers are deposited while the conventional hard mask is in place. In addition, a shallow mill may be performed as part of providing the hard bias structure. A capping layer may be deposited after the shallow ion mill is completed. The capping layer typically includes a noble metal such as Ru and/or Ta.

The conventional mask may then be removed, via step 18. For a conventional photoresist mask, step 18 may include performing a lift-off. For a hard mask, another process, such as ion milling may be used. A planarization such as a chemical mechanical planarization (CMP) is performed, via step 20. The stripe height of the sensor is then defined, via step 22. Note that in some instances, the stripe height may be defined in step 22 prior to the steps 12-20. An insulator such as aluminum oxide is deposited on the transducer, via step 24.

Although the conventional method 10 allows the conventional transducer to be fabricated, there are several drawbacks. The current trend in magnetic recording is to decreased track widths. The track width is approaching the sub-thirty micron range. At such low thicknesses, a conventional photoresist mask is consumed quickly in part because faceting of the photoresist mask may be significant at lower track widths. Thus, the desired track width may not be able to be achieved is a conventional photoresist mask is provided in step 12. If a conventional hard mask is used instead, the hard mask may only be removed by a CMP and/or ion milling. This process may be difficult particularly for large areas for which the CMP capability may be limited and ion milling may be less effective. Further, the hard mask material may be stressful. A hard mask under stress may cause delamination of the magnetoresistive sensor film, particularly during the planarization in step 20. Thus, the conventional method may not be capable of producing a read sensor at higher magnetic recording densities and the attendant lower track widths.

Accordingly, what is needed is a system and method for improving the fabrication of a magnetic recording read transducer.

BRIEF SUMMARY OF THE INVENTION

A method for fabricating a read sensor on a substrate for a read transducer is described. The read transducer has a field region and a sensor region corresponding to the read sensor. The method includes depositing a read sensor stack including a plurality of layers on the substrate. A hybrid mask including a hard mask and a field mask is provided. The hard mask includes sensor portion covering the sensor region of read sensor stack and a field portion covering the field region of the read sensor stack. However, the hard mask exposes a first portion of the read sensor stack between the sensor portion and the field portion of the hard mask. The field mask covers the field portion of the hard mask. The field mask exposes the sensor portion of the hard mask on the sensor region and a second portion of the read sensor stack between the sensor region and the field region. The read sensor is defined from the read sensor stack in a track width direction. Defining the read sensor includes substantially removing the second portion of the read sensor stack. At least one hard bias layer is deposited. A portion of the hard bias layer resides on the field mask. A portion of the hard bias layer(s) adjoining the sensor region is sealed. The field mask is lifted off. The transducer is also planarized.

DETAILED DESCRIPTION OF THE PREFERRED EMBODIMENTS

Figure 2:
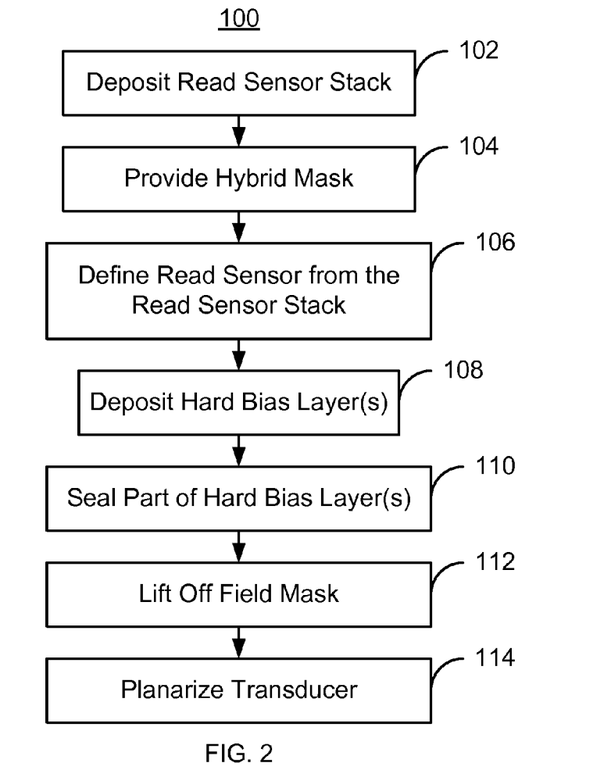
FIG. 2 is a flow chart depicting an exemplary embodiment of a method for fabricating a read sensor using a hybrid mask.

FIG. 3 is an exemplary embodiment of a method 100 for providing magnetic recording transducer. For simplicity, some steps may be omitted. The method 100 is also described in the context of providing a single recording transducer. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer. For example, the method 100 may start after layers underlying the magnetoresistive sensor, such as a TMR sensor have been fabricated.

A read sensor stack is deposited on the substrate, via step 102. The magnetoresistive layers may include a pinning layer, a pinned layer, a nonmagnetic spacer layer, and a free layer. In addition, seed and/or capping layers may be used. The pinning layer may be an AFM or other layer configured to fix, or pin, the magnetization of the pinned layer. The pinned layer may be a synthetic antiferromagnetic (SAF) layer including magnetically coupled ferromagnetic layers separated by a nonmagnetic layer. The ferromagnetic layers may be termed pinned and reference sub-layers. The nonmagnetic spacer layer may be a conductive layer for a giant magnetoresistive structure, an insulator for a TMR structure, or may have another structure. The free layer is ferromagnetic and has a magnetization that is free to change in response to an external magnetic field, for example from a media. The free layer may have multiple sub-layers, as may the pinned and reference sub-layers. In addition, a capping layer may also be provided on the read sensor stack. Further, the transducer may be considered to have a sensor region, in which the magnetoresistive structure is to be formed, and a field region distal from the magnetoresistive structure.

A hybrid mask is provided on the read sensor stack, via step 104. The hybrid mask includes a hard mask and a field mask. The hard mask includes sensor portion and a field portion. The sensor portion of the hard mask covers the sensor region of read sensor stack. The field portion of the hard mask covers the field region of the read sensor stack. Thus, the hard mask exposes a of the read sensor stack between the sensor and field portions of the hard mask. The field mask covers the field portion of the hard mask. The field mask exposes the sensor portion of the hard mask that is on the sensor region and a portion of the read sensor stack between the sensor region and the field region. In some embodiments, the portion of the read sensor stack exposed by the hard mask is the same as that which is exposed by the field mask. However, in other embodiments, the portions of the read sensor stack exposed by the hard mask and field mask differ. In some embodiments, the hard mask is formed of one or more of SiC, aluminum oxide, amorphous carbon, Ta, and tantalum oxide. In some embodiments, the field mask is formed from photoresist or an analogous material. The field mask has a sufficient thickness for the hard mask RIE, read read sensor milling, and lift off. For example, the thickness of a photoresist field mask may be approximately one micron or more in some embodiments. In some embodiments, providing the hybrid mask includes depositing a hard mask layer and providing a first mask on the hard mask layer. A first portion of the first mask covers the sensor portion of the hard mask. A second portion of the first mask covers at least a portion of the field portion of the hard mask. The first mask may include a bottom antireflective coating layer, such as an AR3 layer and a photoresist layer on the AR3 layer. In some embodiments, the pattern of the first mask is transferred to the hard mask layer, forming the hard mask. In some embodiments, another layer is provided on the hard mask layer. In some such embodiments, this layer is a Cr layer. In such embodiments, the pattern of the first mask is transferred to the additional layer. A photoresist layer may then be provided on the hard mask. The photoresist layer is then pattern to form the field mask that covers the field region, but exposes the sensor region. In some embodiments, the pattern of the field mask plus the portion of the first mask in the sensor region are transferred to the hard mask. In such embodiments, the portion of the underlying read sensor stack between the sensor region and the field region exposed by the hard mask and the field mask is the same. However, the hard mask covers the sensor region, while the field mask typically does not.

The read sensor is defined from the read sensor stack in the track width direction, via step 106. The exposed portion of the read sensor stack is thus removed. Step 106 may include performing an ion mill. The read sensor may be a TMR junction, a GMR junction, or other sensor. The read sensor has junction angles at its base in the track width direction and a track width. In some embodiments, the track width is less than thirty nanometers.

At least one hard bias layer for a hard bias structure is deposited, via step 108. Hard bias material(s) include those materials having a sufficiently high coercivity that normal operation of the magnetoresistive structure does not alter the magnetization (and thus the bias) of the hard bias materials. A portion of the hard bias material(s) is substantially adjacent to the magnetoresistive structure in the track width direction. An insulating layer may be deposited prior to the hard bias materials. In addition, seed and/or capping layers may also be provided in step 108. The seed and/or capping layer(s) may each include sub-layers.

A portion of the hard bias layer(s) adjoining the sensor region is sealed, via step 110. In some embodiments, sealing is accomplished by depositing one or more layers. For example, sealing the hard bias layer(s) may include depositing a bilayer including a Ta sub-layer and a Ru sub-layer on the Ta sub-layer. In another embodiment, the step of sealing the hard bias layer(s) may include depositing a trilayer including a Ru sub-layer sandwiched by two Ta sub-layers.

The field mask is lifted off, via step 112. Thus the portion of the hard bias layer(s) on the field mask is removed. The transducer is planarized, via step 114. Step 114 may include performing a CMP. In other embodiments, other mechanisms may be used to planarize the transducer. Thus, a portion of the hard bias structure as well as the hard mask is removed. The hard bias may thus be removed from the region on top of the read sensor. In some embodiments, a remaining portion of the hard mask is removed after the transducer is planarized. For example, an RIE appropriate for the hard mask maybe performed. Because the hard mask may be thinned in the planarization of step 114, removal of the hard mask may be facilitated. Fabrication of the transducer may then be completed. For example, the stripe height (length perpendicular to the ABS) for the read sensor may be defined. A nonmagnetic gap, shields, and other structures may also be formed.

Figure 3:
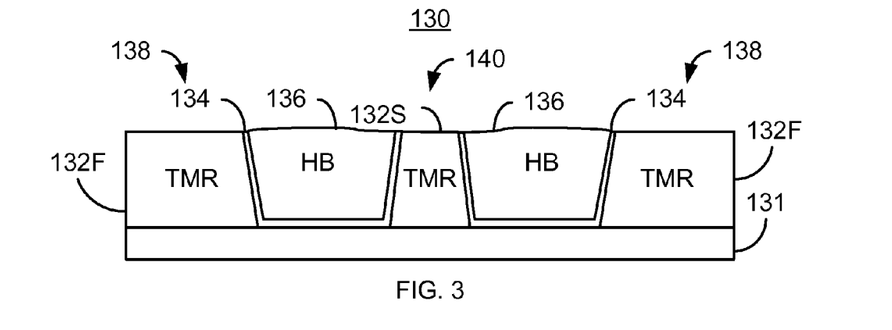
FIG. 3 depicts an ABS view of an exemplary embodiment of a magnetic recording read transducer.

FIG. 3 depicts the transducer 130 after the method 100 is completed. For clarity, FIG. 3 is not to scale. In addition, only a portion of the transducer 130 is shown. The transducer is also described in the context of particular layers and structures. However, sublayers and/or substructures may also be provided. In the embodiment shown, the read sensor stack is a TMR stack and has been so labeled. The read transducer 130 includes a magnetoresistive sensor 132S, remaining TMR stack 132F, insulating layer 134, hard bias structures 136 on underlying layers 131. Thus, the underlying layers 131 may be termed a substrate. The transducer 130 includes field regions 138 and sensor region 140 in which the TMR sensor 132S resides. Because they are in the field regions 138, the remaining portions of the read sensor stack are labeled 132F.

Using the method 100, the transducer 130 having a magnetoresistive read sensor 132 may be formed. Because a hard mask is used in the sensor region 140 without a photoresist mask on this region 140, a read sensor 132S having the desired small track width may be fabricated. Because a field mask that can be lifted off or removed in some analogous, simple fashion, the hard bias material(s) may be more easily removed from the larger field regions 138. Damage to the underlying layers 132F and/or 136 may thus be reduced or avoided. Because the hard bias layer(s) 136 are sealed, oxidation and/or other issues with the hard bias layer(s) 136 may be mitigated or prevented. Further, planarizing the transducer, and the attendant thinning of the hard mask, may reduce stresses due to the hard mask. This may limit or prevent delamination of the TMR sensor 132S during removal of the hard mask. Thus, the fabrication of the transducer 130 may be improved.

Figure 4:
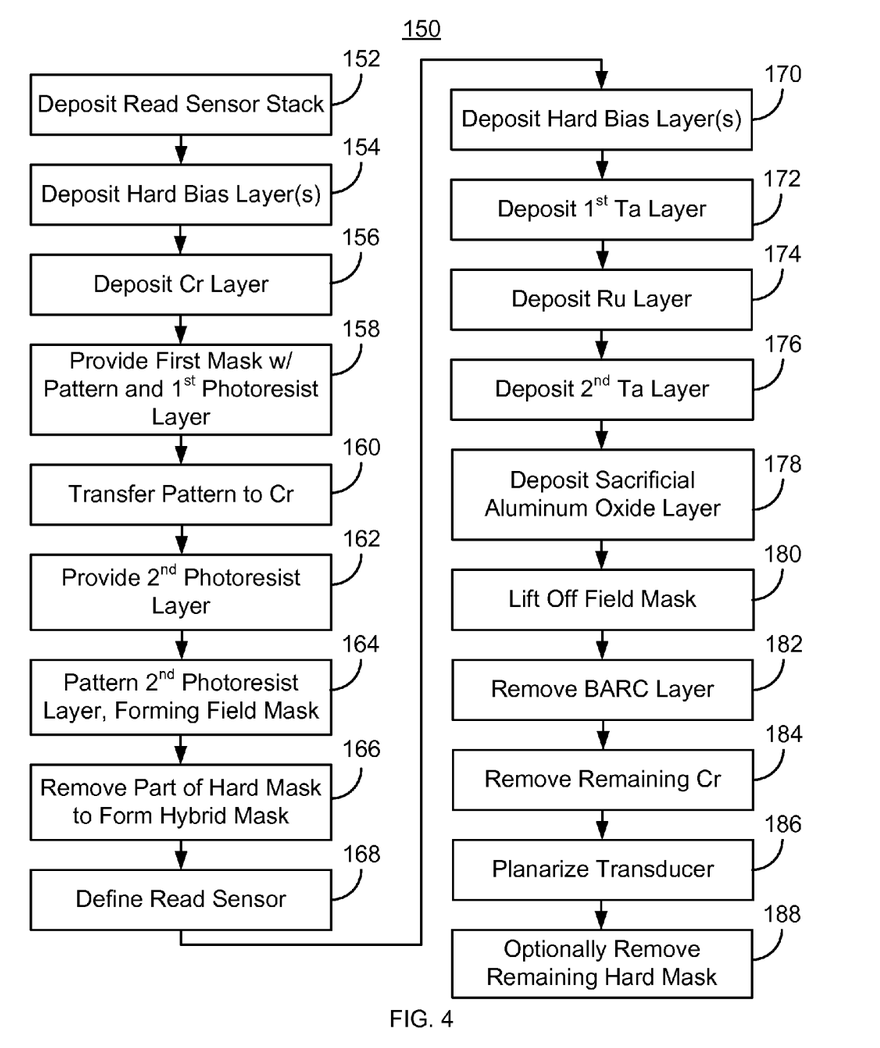
FIG. 4 is a flow chart depicting another exemplary embodiment of a method for fabricating a read sensor using a hybrid mask.

FIG. 4 is a flow chart depicting another exemplary embodiment of a method 150 for fabricating a magnetic recording transducer. FIGS. 5-14 depict ABS views of another exemplary embodiment of a magnetic recording transducer 200 during fabrication. Because the transducer 200 is being formed in FIGS. 5-13, the transducer 200 is denoted as transducer 200A, 200B, 200C, 200D, 200E, 200F, 200G, 200H, 200I and 200J in FIGS. 5, 6, 7, 8, 9, 10, 11, 12, 13 and 14, respectively. However, the transducer is simply referred to as the transducer 200 in the text. For clarity, FIGS. 5-14 are not to scale. The method 150 is described in the context of the transducer 200. For simplicity, some steps of the method 150 may be omitted. The method 150 is also described in the context of providing a single recording transducer 200. However, the method 150 may be used to fabricate multiple transducers at substantially the same time. The method 150 and transducer 200 are also described in the context of particular layers. A particular layer may include multiple materials and/or multiple sub-layers. The method 150 also may start after formation of other portions of the magnetic recording transducer 200. Further, the transducer may be considered to have a device region, in which the magnetoresistive structure is to be formed, and a field region distal from the magnetoresistive structure.

A stack for the read sensor is deposited, via step 152. The magnetoresistive layers may include a pinning layer, a pinned layer, a nonmagnetic spacer layer, and a free layer. In addition, seed and/or capping layers may be used. Examples of such layers are described above.

A hard mask layer is provided on the read sensor stack, via step 154. Step 154 includes blanket depositing a hard mask layer such as SiC, amorphous carbon (e.g. sputtered carbon), aluminum oxide, Ta, and/or tantalum oxide on the read sensor stack. For the purposes of describing the method 150, it is assumed that an SiC layer is used. In some embodiments, the step 154 includes depositing a hard mask layer having a thickness of not more than seventy nanometers. In another embodiment, the hard mask layer provided in step 154 has a thickness of not more than sixty nanometers. However, in other embodiments, other thicknesses of the hard mask layer may be used.

A Cr layer is deposited on the hard mask layer, via step 156. In other embodiments, another layer may be used.

A first mask is provided, via step 158. The first mask may include a BARC layer and a photoresist layer on the BARC layer. The first mask has a pattern that includes a first portion covering a sensor portion of the hard mask layer and a second portion covering at least a portion of the field region.

Figure 5:
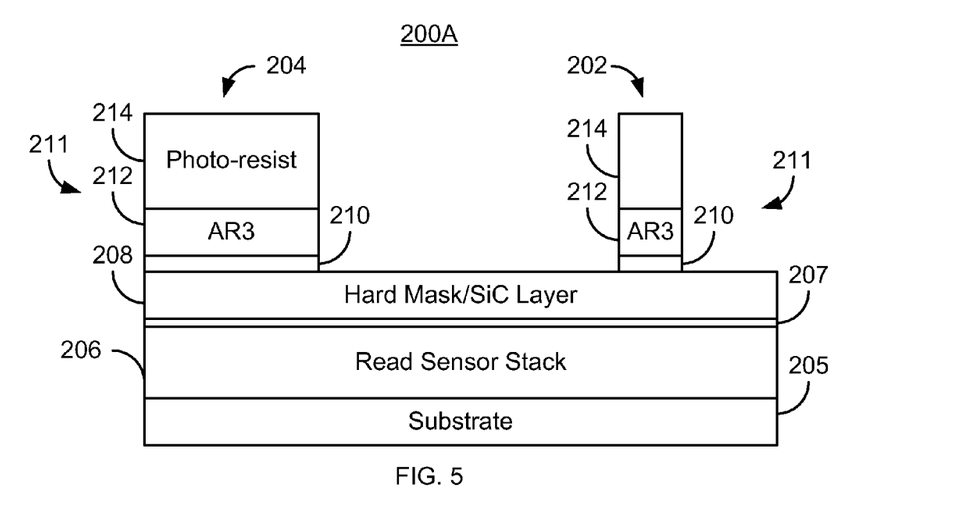
FIGS. 5-14 depict an exemplary embodiment of a magnetic recording transducer during fabrication.
Figure 6:
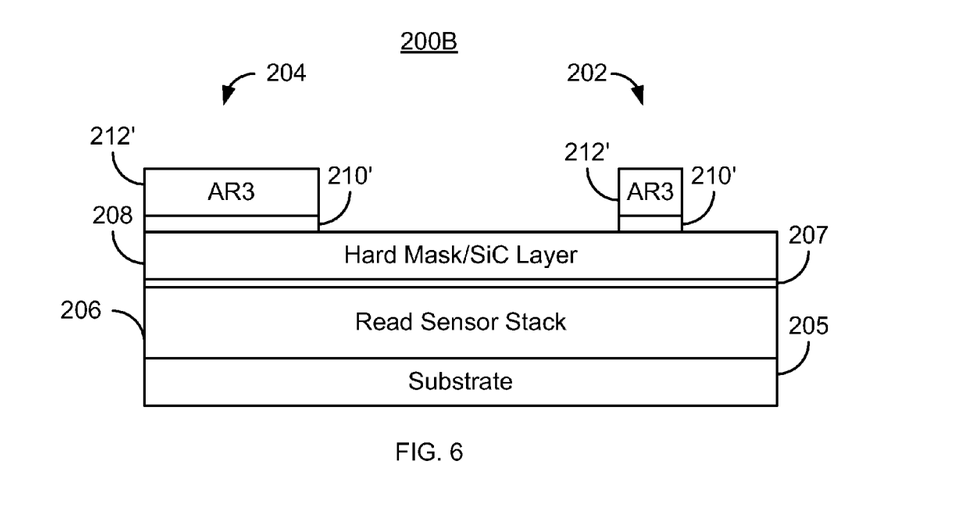

The pattern of the first mask is transferred to the Cr layer, via step 160. Thus, the Cr is removed from a portion of the hard mask layer. The resist portion of the first mask may then be removed using a resist strip. FIG. 5 depicts an ABS view of the transducer 200 after the exposed portion of the Cr is removed in step 160. Thus, a sensor portion 202 and a field portion 204 of the transducer 204 are shown. The transducer 200 also includes a read sensor stack 206 on underlying layer(s) indicated as a substrate 205. The substrate 205 may include underlying layers such as shield or insulating gap layers. Also shown are a capping layer 207 for the read sensor stack 206 and a hard mask layer 208. In addition, the hard mask layer 208 is shown as being blanket deposited on the read sensor stack 206. A Cr layer 210 that has been patterned is also shown. The first mask 211 is included. The first mask 211 includes an AR3 layer 212 and a photoresist layer 214. The AR3 layer acts as a BARC layer for the photoresist layer 214. The first mask 211 covers part of the field region 204 and the sensor region 202. FIG. 6 depicts the transducer 200 after the photoresist mask 214 is removed after the exposed portion of the Cr is removed. Thus, the AR3 layer 212' remains from the first mask 211.

Figure 7:
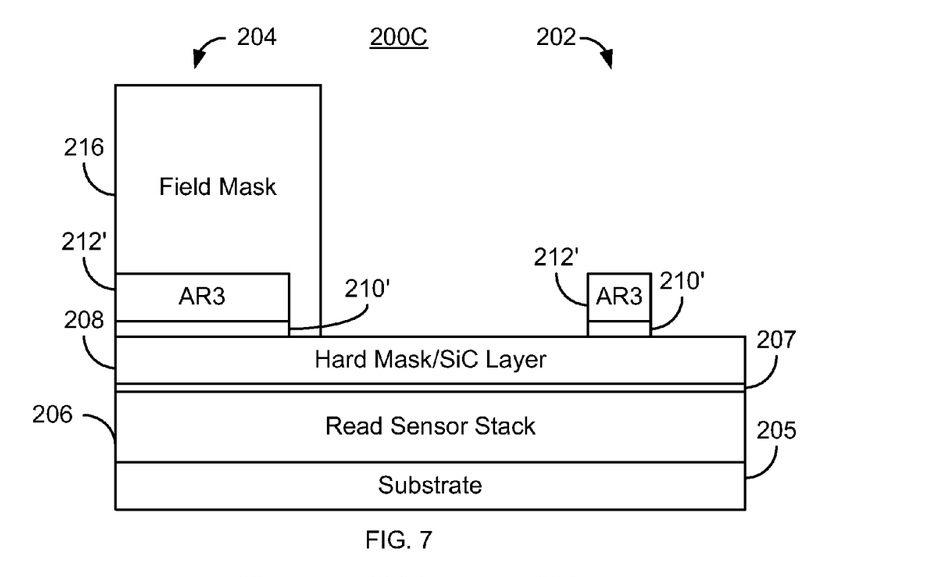

Another photoresist layer is provided, via step 162. This photoresist layer is patterned to form a field mask, via step 164. The field mask also covers the remaining portion 212' of the first mask 211 in the field region 204. Further, the field mask covers the field portion of the hard mask layer 207. FIG. 7 depicts the transducer 200 after step 164 is performed. Thus, the field mask 216 is shown. In the embodiment shown, the field mask 216 extends beyond the first mask/BARC layer 212'. However, in other embodiments, the field mask 216 may extend only to the edge of the first mask/BARC layer 212'.

Figure 8:
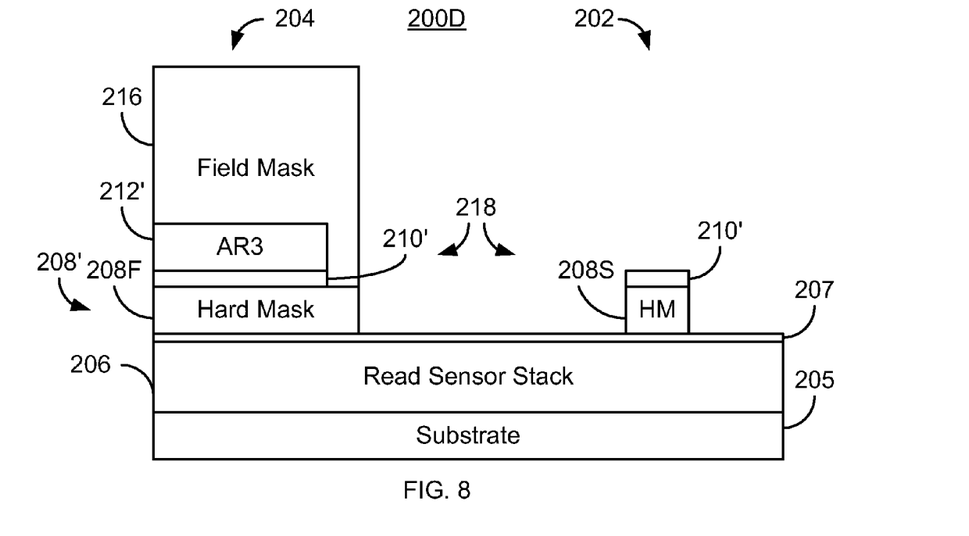

The pattern of the field mask 216 and remaining exposed portion of the first mask—the BARC layers 212' and Cr layer 210' in the sensor region 202 is transferred to the hard mask 208, via step 166. Thus, the exposed portion of the hard mask 208 between the field mask 216 and BARC layer 212'/Cr 210' in the sensor region 202 is removed. FIG. 8 depicts the transducer 200 after step 166 is performed. A portion of the hard mask layer 208 has been removed, hard mask 208'. The hard mask 208' includes portions 208S and 208F in the sensor region 202 and the field region 204, respectively. The hard mask 208' and the field mask 216 together form hybrid mask 218. In some embodiments, any remaining portion of the first mask 211, such as the BARC 212' as well as the Cr layer 210' may be considered part of the hybrid mask.

Figure 9:
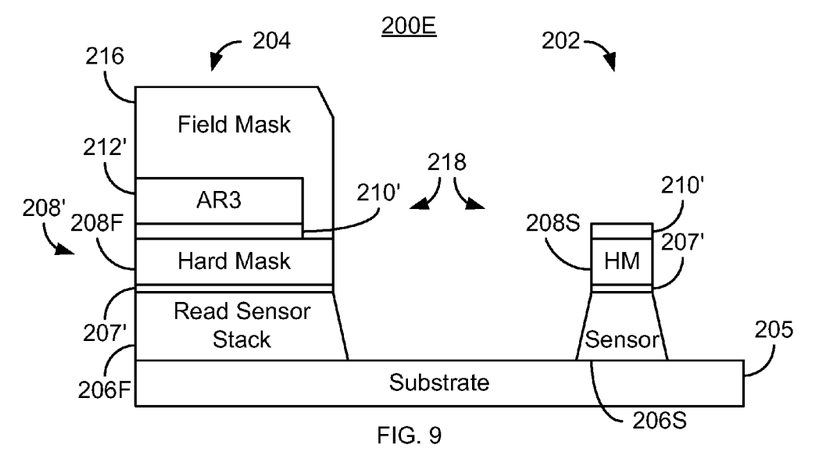

The read sensor is defined from the read sensor stack 206 in a track width direction, via step 168. In some embodiments, the read sensor may also be defined in the stripe height direction. Step 168 may include performing an ion mill. Thus, a portion of the read sensor stack 206 between the sensor region 202 and the field region 204 is removed. Also in step 168 any remaining portion of the first photoresist layer 214 (shown in FIG. 5 only) on the sensor region 202 is consumed. In the embodiment shown, the first photoresist layer 214 is consumed previously. FIG. 9 depicts the transducer 200 after step 168 is performed. Thus, the sensor 206S has been formed. Because of the hard mask 208S, the track width of the sensor 206S may be small, including in the sub-thirty micron range. In addition, a portion of the read sensor stack 206F covered by the field mask 216 and portion 208F of the hard mask 208F remains in the field 204.

Figure 10:
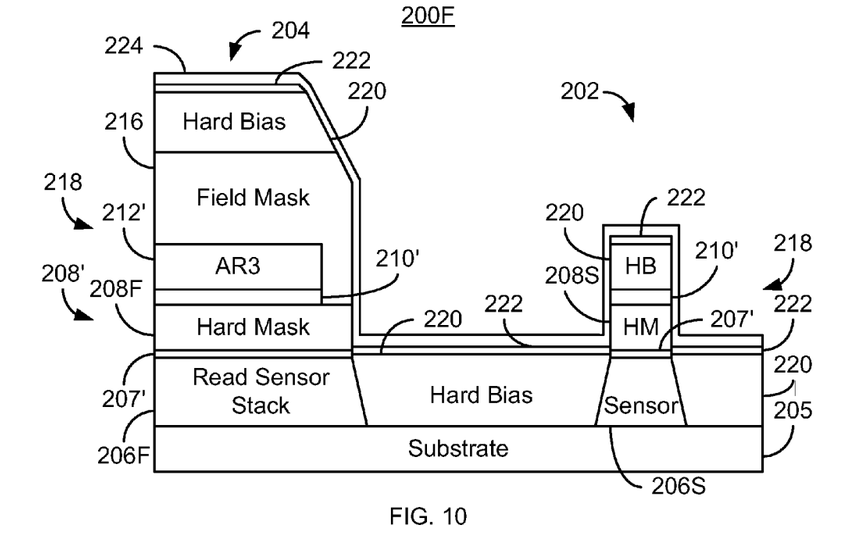

One or more hard bias layers are deposited, via step 170. In some embodiments, the hard bias layer(s) are blanket deposited. FIG. 10 depicts the transducer 200 after step 170 is performed. A portion of the hard bias layer(s) are on the field mask 216 of the hybrid mask 218, a portion of the hard bias layer(s) would be between the field region 204 and the sensor region 202, and a portion of the hard bias layer(s) would be on the sensor region 202.

A first Ta layer is deposited, via step 172. A Ru layer is deposited on the first Ta layer, via step 174. A second Ta layer is deposited on the Ru layer, via step 176. Thus, the three layers form a sealing layer. In other embodiments, other layer(s) may be deposited to seal the hard bias layers. A sacrificial aluminum oxide layer on the second Ta layer, via step 178. FIG. 10 depicts the transducer 100 after step 178 is performed. Thus, hard bias layer(s) 220 are shown. In addition, a sealing layer 222 that would include the Ta/Ru/Ta trilayer is also depicted. Sacrificial aluminum oxide layer 224 that covers the portion of the transducer 200 depicted. In some embodiments, the sacrificial layer may be thinner on the sidewalls of the hybrid mask 218 due to the shadowing effect.

Figure 11:
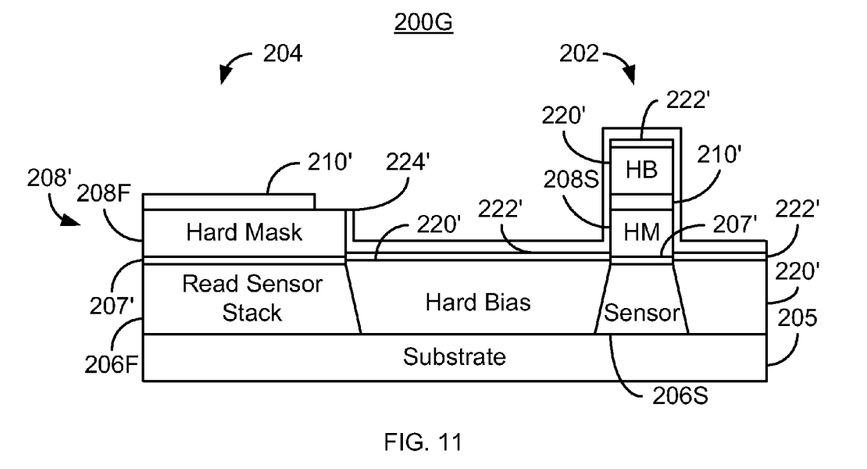

The field mask 216 is lifted off, via step 180. In addition, the BARC layer 212' is removed from the field region 204, via step 182. FIG. 11 depicts the transducer 200 after step 182 is performed. Thus, the field mask 216 and BARC 214' have been removed. Portions of the hard bias 220, sealing layer(s) 222, and sacrificial aluminum oxide layer 224 on the field mask 216 have been removed. Thus, only hard bias layer(s) 220', sealing layer(s) 222', and sacrificial layer 224' remain.

Figure 12:
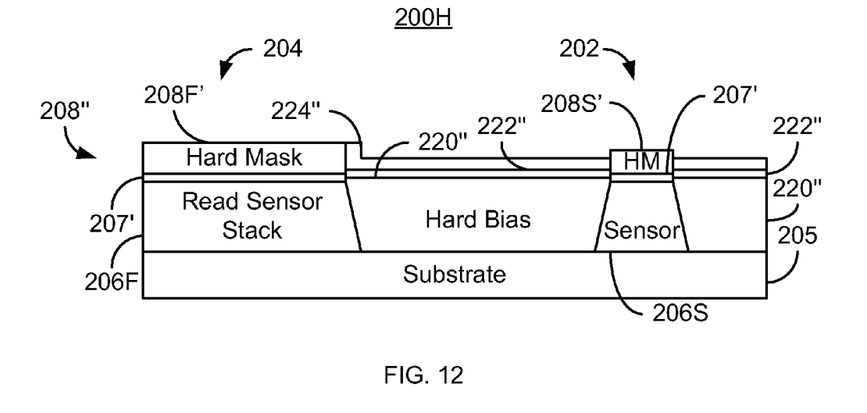

A remaining portion of the Cr layer 210' is removed, via step 184. In some embodiments, a portion of the hard mask 208' is also removed. Further, the portion of the hard bias layer(s) 220' may be removed. FIG. 12 depicts the transducer 200 after step 184 is performed. Thus, the Cr layer 210 has been removed. The hard mask 208" remains, but has been thinned. More specifically, the hard mask 208S' and 208F' have been thinned. The may reduce the stress in the hard mask 208F' and 208S'. Thus, delamination of the sensor stack 206F and the sensor 206S in subsequent steps may be reduced. Further, adjusting of the thickness of the sacrificial layer 224' may allow the hard mask thickness 208F' and 208S' to be thinned to the desired thickness in step 184. Thus, the process margins for a subsequent planarization may be improved.

Figure 13:
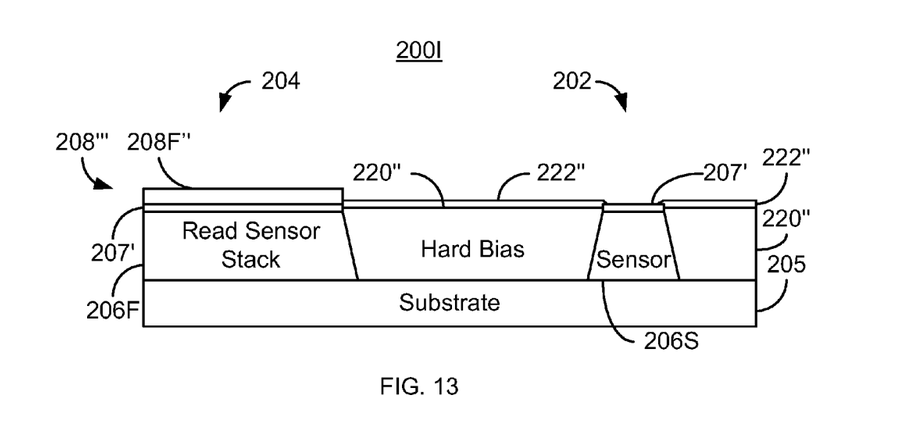
Figure 14:
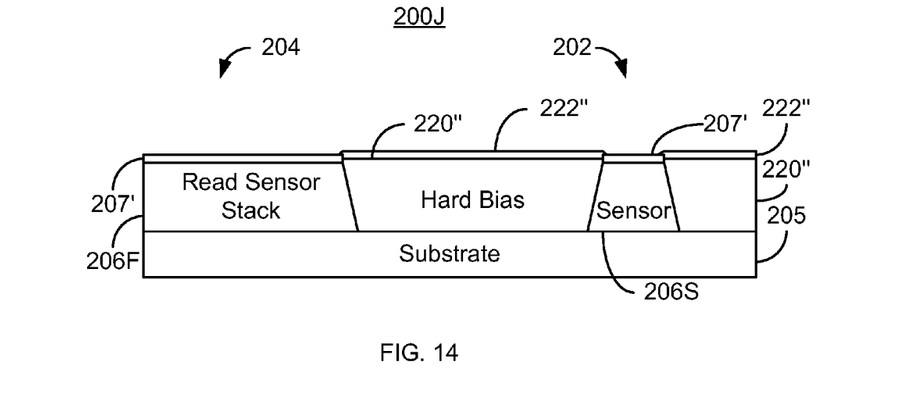

The transducer is planarized, via step 186. In some embodiments, step 186 includes performing a CMP. FIG. 13 depicts the transducer 200 after step 186 is performed. In the embodiment shown, a portion of the hard mask 208F'" in the field region remains. However, in another embodiment, the hard mask 208" may be completely removed. Thus, in some embodiments, any hard mask 208" remaining is optionally removed, via step 188. FIG. 14 depicts the transducer 200 after step 186 or 188 has been performed. Thus, the hard mask 208" has been completely removed. Fabrication of the transducer 200 may then be completed. Using the method 150, the transducer 200 having a magnetoresistive read sensor 206S may be formed. Use of the hybrid mask 218 may facilitate fabrication of the transducer. Because the hard mask 208S of the hybrid mask 218 is used in the sensor region 202 without a photoresist mask on this region 202, a read sensor 206S having the desired small track width may be fabricated. Because a field mask 216 that can be lifted off or removed in some analogous, simple fashion, the hard bias material(s) 220 may be more easily removed from the larger field regions 204. Damage to the underlying layers 2206F and 206S may thus be reduced or avoided. Because the hard bias layer(s) 220 are sealed using sealing layer(s) 222, oxidation and/or other issues with the hard bias layer(s) 220 may be mitigated or prevented. Further, planarizing the transducer, and the attendant thinning of the hard mask 208'", may reduce stresses due to the hard mask 208". This may limit or prevent delamination of the TMR stack 206F and 206S Thus, the fabrication of the transducer 200 may be improved.

We claim:

1. A method for fabricating a read sensor on a substrate for a read transducer, the read transducer having a field region and a sensor region corresponding to the read sensor, the method comprising:
   depositing a read sensor stack including a plurality of layers on the substrate;
   providing a hybrid mask including a hard mask and a field mask, the hard mask including a sensor portion covering the sensor region of the read sensor stack and a field portion covering the field region of the read sensor stack, the hard mask exposing a first portion of the read sensor stack between the sensor portion and the field portion of the hard mask, the field mask covering the field portion of the hard mask, the field mask exposing the sensor portion of the hard mask on the sensor region and a second portion of the read sensor stack between the sensor region and the field region;
   defining the read sensor from the read sensor stack in a track width direction, the defining the read sensor including substantially removing the second portion of the read sensor stack;
   depositing at least one hard bias layer, a portion of the at least one hard bias layer residing on the field mask;
   sealing a portion of the at least one hard bias layer adjoining the sensor region;
   lifting off the field mask; and
   performing a planarization.

2. The method of claim 1 wherein the first portion is substantially identical to the second portion.

3. The method of claim 1 wherein the step of providing the hybrid mask further includes:
   depositing a hard mask layer;
   providing a first mask having a first portion covering the sensor portion of the hard mask and a second portion covering at least a portion of the field portion of the hard mask;
   providing an additional photoresist layer;
   patterning the additional photoresist layer to provide the field mask, the field mask covering the second portion of the first mask and the field portion of the hard mask layer; and
   removing a portion of the hard mask layer to provide the hard mask.

4. The method of claim 3 wherein the step of providing the first mask further includes:
   depositing a Cr layer;
   providing a resist mask having a resist mask pattern corresponding to the first portion and the second portion; and
   transferring the resist mask pattern to the Cr layer.

5. The method of claim 4 wherein the resist mask includes a bottom antireflective coating (BARC) layer and a photoresist layer on the BARC layer.

6. The method of claim 1 wherein the step of sealing further includes:
   depositing at least one layer.

7. The method of claim 6 wherein the step of depositing the at least one layer further includes:
   depositing a first Ta layer;
   depositing a Ru layer on the first Ta layer; and
   depositing a second Ta layer on the Ru layer.

8. The method of claim 1 further comprising:
   removing a remaining portion of the hard mask after the step of planarizing the transducer.

9. The method of claim 1 wherein the hard mask includes at least one of SiC, aluminum oxide, amorphous carbon, Ta, and tantalum oxide.

10. A method for fabricating a read sensor on a substrate for a read transducer, the read transducer having a field region and a sensor region corresponding to the read sensor, the method comprising the sequential steps of:
   depositing a read sensor stack including a plurality of layers on the substrate;
   depositing a hard mask layer;
   depositing a Cr layer on the hard mask layer;
   providing a first mask having a pattern, the pattern including a first portion covering
   a sensor portion of the hard mask layer and a second portion covering at least a portion of the field region, the first mask including a bottom antireflective coating (BARC) layer and a first photoresist layer on the BARC layer;
   transferring the pattern to the Cr layer;
   providing a second photoresist layer;
   patterning the second photoresist layer to provide a field mask covering the field region, the field mask also covering the second portion of the first mask and a field portion of the hard mask layer; and
   removing a portion of the hard mask layer to provide a hard mask covering the sensor region and the field region, the hard mask and the field mask forming a hybrid mask;

defining the read sensor from the read sensor stack in a track width direction, the defining the read sensor including substantially removing a portion of the read sensor stack between the sensor region and the field region and substantially consuming a portion of the first photoresist layer on the sensor region;

depositing at least one hard bias layer, a portion of the at least one hard bias layer residing on the field mask;

depositing a first Ta layer;

depositing a Ru layer on the first Ta layer;

depositing a second Ta layer on the Ru layer;

depositing a sacrificial aluminum oxide layer on the second Ta layer;

lifting off the field mask;

removing the BARC layer;

removing a remaining portion of the Cr layer; and performing a planarization.

11. The method of claim 10 wherein the step of removing the remaining portion of the Cr layer removes a portion of the hard mask.

* * * * *